US009002032B2

(12) United States Patent
Norris

(10) Patent No.: US 9,002,032 B2
(45) Date of Patent: Apr. 7, 2015

(54) PARAMETRIC SIGNAL PROCESSING SYSTEMS AND METHODS

(75) Inventor: Elwood G. Norris, Poway, CA (US)

(73) Assignee: Turtle Beach Corporation, Poway, CA (US)

( * ) Notice: Subject to any disclaimer, the term of this patent is extended or adjusted under 35 U.S.C. 154(b) by 203 days.

(21) Appl. No.: 13/160,048

(22) Filed: Jun. 14, 2011

(65) Prior Publication Data

US 2012/0148070 A1 Jun. 14, 2012

Related U.S. Application Data

(60) Provisional application No. 61/354,533, filed on Jun. 14, 2010, provisional application No. 61/445,195, filed on Feb. 22, 2011.

(51) Int. Cl.

| | |
|---|---|
| ***H03G 5/00*** | (2006.01) |
| ***H04R 1/42*** | (2006.01) |
| ***H04R 9/04*** | (2006.01) |
| ***H01F 3/08*** | (2006.01) |
| ***H01F 19/04*** | (2006.01) |
| *H04B 3/00* | (2006.01) |
| *H04R 3/00* | (2006.01) |

(52) U.S. Cl.
CPC .. *H04R 1/42* (2013.01); *H04R 9/04* (2013.01); *H01F 3/08* (2013.01); *H01F 19/04* (2013.01); *H04R 3/00* (2013.01)

(58) Field of Classification Search
CPC ...... H04R 3/00; H04R 2217/03; H04R 1/403; H04R 1/42; H04R 9/04; H03G 5/00; H01F 3/08
USPC ............ 381/103, 104, 77, 137, 111, 112, 116
See application file for complete search history.

(56) References Cited

U.S. PATENT DOCUMENTS

| | | | |
|---|---|---|---|
| 1,616,639 | A | 2/1927 | Sprague |
| 1,764,008 | A | 6/1930 | Crozier |
| 1,799,053 | A | 3/1931 | Mache |
| 1,809,754 | A | 6/1931 | Steedle |
| 1,951,669 | A | 3/1934 | Ramsey |

(Continued)

FOREIGN PATENT DOCUMENTS

| | | |
|---|---|---|
| JP | H2265400 | 10/1990 |
| JP | 2005/353989 A | 12/2005 |

(Continued)

OTHER PUBLICATIONS

U.S. Appl. No. 13/160,051, filed Jun. 14, 2011; Elwood G. Norris.

(Continued)

*Primary Examiner* — Vivian Chin
*Assistant Examiner* — Ammar Hamid

(57) ABSTRACT

A signal processing system for generating a parametric signal comprises an audio compressor, operable to compress a dynamic range of an audio input signal, and an equalization network, operable to equalize the audio signal. A low pass filter is operable to remove high portions of the audio signal and a high pass filter is operable to remove low portions of the audio signal. An oscillator circuit is operable to generate a carrier signal, and a modulation circuit is operable to combine the audio signal with the carrier signal to produce at least one modulated carrier signal.

11 Claims, 4 Drawing Sheets

(56) References Cited

U.S. PATENT DOCUMENTS

| | | | | | |
|---|---|---|---|---|---|
| 1,983,377 | A | | 12/1934 | Kellogg | |
| 2,461,344 | A | | 2/1949 | Olson | |
| 2,855,467 | A | | 10/1958 | Curry | |
| 2,872,532 | A | | 2/1959 | Buchmann et al. | |
| 2,935,575 | A | | 5/1960 | Bobb | |
| 2,975,243 | A | | 3/1961 | Katella | |
| 2,975,307 | A | | 3/1961 | Schroeder et al. | |
| 3,008,013 | A | | 11/1961 | Williamson et al. | |
| 3,012,222 | A | | 12/1961 | Hagemann | |
| 3,136,867 | A | | 6/1964 | Brettell | |
| 3,345,469 | A | | 10/1967 | Rod | |
| 3,373,251 | A | | 3/1968 | Seeler | |
| 3,389,226 | A | | 6/1968 | Peabody | |
| 3,398,810 | A | | 8/1968 | Clark, III | |
| 3,461,421 | A | | 8/1969 | Stover | |
| 3,544,733 | A | | 12/1970 | Reylek | |
| 3,612,211 | A | | 10/1971 | Clark, III | |
| 3,613,069 | A | | 10/1971 | Cary, Jr. | |
| 3,654,403 | A | | 4/1972 | Bobb | |
| 3,674,946 | A | | 7/1972 | Winey | |
| 3,710,332 | A | | 1/1973 | Tischner et al. | |
| 3,723,957 | A | | 3/1973 | Damon | |
| 3,742,433 | A | | 6/1973 | Kay et al. | |
| 3,787,642 | A | | 1/1974 | Young, Jr. | |
| 3,816,774 | A | | 6/1974 | Ohnuki et al. | |
| 3,821,490 | A | | 6/1974 | Bobb | |
| 3,829,623 | A | | 8/1974 | Willis et al. | |
| 3,833,771 | A | | 9/1974 | Collinson | |
| 3,836,951 | A | | 9/1974 | Geren et al. | |
| 3,892,927 | A | | 7/1975 | Lindenberg | |
| 3,919,499 | A | | 11/1975 | Winey | |
| 3,941,946 | A | | 3/1976 | Kawakami et al. | |
| 3,997,739 | A | | 12/1976 | Kishikawa et al. | |
| 4,056,742 | A | | 11/1977 | Tibbetts | |
| 4,064,375 | A | | 12/1977 | Russell et al. | |
| 4,146,847 | A | | 3/1979 | Otao et al. | |
| 4,160,882 | A | | 7/1979 | Driver | |
| 4,207,571 | A | | 6/1980 | Passey | |
| 4,210,786 | A | | 7/1980 | Winey | |
| 4,242,541 | A | | 12/1980 | Ando | |
| 4,245,136 | A | | 1/1981 | Krauel, Jr. | |
| 4,284,921 | A | | 8/1981 | Lemonon et al. | |
| 4,289,936 | A | | 9/1981 | Civitello | |
| 4,295,214 | A | | 10/1981 | Thompson | |
| 4,314,306 | A | | 2/1982 | Darrow | |
| 4,322,877 | A | | 4/1982 | Taylor | |
| 4,369,490 | A | | 1/1983 | Blum | |
| 4,378,596 | A | | 3/1983 | Clark | |
| 4,385,210 | A | | 5/1983 | Marquiss | |
| 4,418,404 | A | | 11/1983 | Gordon et al. | |
| 4,419,545 | A | | 12/1983 | Kuindersma | |
| 4,429,193 | A | | 1/1984 | Busch-Vishniac et al. | |
| 4,439,642 | A | | 3/1984 | Reynard | |
| 4,471,172 | A | | 9/1984 | Winey | |
| 4,480,155 | A | | 10/1984 | Winey | |
| 4,514,773 | A | * | 4/1985 | Susz | 360/77.01 |
| 4,550,228 | A | | 10/1985 | Walker et al. | |
| 4,558,184 | A | | 12/1985 | Busch-Vishniac et al. | |
| 4,593,160 | A | | 6/1986 | Nakamura | |
| 4,593,567 | A | | 6/1986 | Isselstein et al. | |
| 4,672,591 | A | | 6/1987 | Breimesser et al. | |
| 4,673,888 | A | | 6/1987 | Engelmann et al. | |
| 4,695,986 | A | | 9/1987 | Hossack | |
| 4,716,353 | A | | 12/1987 | Engelmann | |
| 4,751,419 | A | | 6/1988 | Takahata | |
| 4,803,733 | A | | 2/1989 | Carver et al. | |
| 4,823,908 | A | | 4/1989 | Tanaka et al. | |
| 4,837,838 | A | | 6/1989 | Thigpen et al. | |
| 4,872,148 | A | | 10/1989 | Kirby et al. | |
| 4,885,781 | A | | 12/1989 | Seidel | |
| 4,887,246 | A | | 12/1989 | Hossack et al. | |
| 4,888,086 | A | | 12/1989 | Hossack et al. | |
| 4,903,703 | A | | 2/1990 | Igarashi et al. | |
| 4,908,805 | A | | 3/1990 | Sprenkels et al. | |
| 4,939,784 | A | | 7/1990 | Bruney | |
| 4,991,148 | A | | 2/1991 | Gilchrist | |
| 5,018,203 | A | | 5/1991 | Sawyers et al. | |
| 5,054,081 | A | | 10/1991 | West | |
| 5,115,672 | A | | 5/1992 | McShane et al. | |
| 5,142,511 | A | | 8/1992 | Kanai et al. | |
| 5,153,859 | A | | 10/1992 | Chatigny et al. | |
| 5,164,991 | A | | 11/1992 | Johnson et al. | |
| 5,210,803 | A | | 5/1993 | Martin et al. | |
| 5,287,331 | A | | 2/1994 | Shindel et al. | |
| 5,317,543 | A | | 5/1994 | Grosch | |
| 5,357,578 | A | | 10/1994 | Taniishi | |
| 5,361,381 | A | | 11/1994 | Short | |
| 5,392,358 | A | | 2/1995 | Driver | |
| 5,430,805 | A | | 7/1995 | Stevenson et al. | |
| 5,487,114 | A | | 1/1996 | Dinh | |
| 5,539,705 | A | * | 7/1996 | Akerman et al. | 367/132 |
| 5,638,456 | A | | 6/1997 | Conley et al. | |
| 5,684,884 | A | | 11/1997 | Nakaya et al. | |
| 5,700,359 | A | | 12/1997 | Bauer | |
| 5,859,915 | A | | 1/1999 | Norris | |
| 5,885,129 | A | | 3/1999 | Norris | |
| 5,889,870 | A | | 3/1999 | Norris | |
| 6,011,855 | A | | 1/2000 | Selfridge et al. | |
| 6,023,153 | A | | 2/2000 | Fink | |
| 6,041,129 | A | | 3/2000 | Adelman | |
| 6,106,399 | A | | 8/2000 | Baker et al. | |
| 6,108,427 | A | | 8/2000 | Norris et al. | |
| 6,151,398 | A | | 11/2000 | Norris | |
| 6,188,772 | B1 | | 2/2001 | Norris et al. | |
| 6,229,899 | B1 | | 5/2001 | Norris et al. | |
| 6,241,612 | B1 | | 6/2001 | Heredia | |
| 6,304,662 | B1 | | 10/2001 | Norris et al. | |
| 6,411,015 | B1 | | 6/2002 | Toda | |
| 6,498,531 | B1 | | 12/2002 | Ulrick et al. | |
| 6,556,687 | B1 | | 4/2003 | Manabe | |
| 6,584,205 | B1 | | 6/2003 | Croft, III et al. | |
| 6,606,389 | B1 | | 8/2003 | Selfridge et al. | |
| 6,628,791 | B1 | | 9/2003 | Bank et al. | |
| 6,631,196 | B1 | | 10/2003 | Higgins | |
| 6,775,388 | B1 | | 8/2004 | Pompei | |
| 6,914,991 | B1 | | 7/2005 | Pompei | |
| 6,940,468 | B2 | | 9/2005 | Aisenbrey | |
| 6,975,731 | B1 | | 12/2005 | Cohen et al. | |
| 7,158,646 | B2 | | 1/2007 | Bank et al. | |
| 7,162,042 | B2 | | 1/2007 | Spencer et al. | |
| 7,224,808 | B2 | | 5/2007 | Spencer et al. | |
| 7,369,665 | B1 | | 5/2008 | Cheng | |
| 7,536,008 | B2 | | 5/2009 | Howes et al. | |
| 7,564,981 | B2 | * | 7/2009 | Croft, III | 381/77 |
| 7,596,229 | B2 | | 9/2009 | Croft, III | |
| 7,657,044 | B2 | | 2/2010 | Pompei | |
| 7,667,444 | B2 | | 2/2010 | Mavay et al. | |
| 7,729,498 | B2 | | 6/2010 | Spencer et al. | |
| 7,850,526 | B2 | | 12/2010 | Mao | |
| 7,957,163 | B2 | | 6/2011 | Hua | |
| 8,027,488 | B2 | * | 9/2011 | Pompei | 381/111 |
| 8,106,712 | B2 | | 1/2012 | Lee | |
| 8,165,328 | B2 | | 4/2012 | Thomsen | |
| 8,391,514 | B2 | | 3/2013 | Norris | |
| 2001/0007591 | A1 | | 7/2001 | Pompei | |
| 2004/0052387 | A1 | | 3/2004 | Norris et al. | |
| 2005/0008168 | A1 | | 1/2005 | Pompei | |
| 2005/0008268 | A1 | | 1/2005 | Plourde et al. | |
| 2005/0086058 | A1 | | 4/2005 | Lemelson et al. | |
| 2005/0100181 | A1 | | 5/2005 | Croft, III et al. | |
| 2005/0152561 | A1 | | 7/2005 | Spencer | |
| 2005/0195985 | A1 | | 9/2005 | Croft, III et al. | |
| 2005/0220311 | A1 | | 10/2005 | Sun | |
| 2006/0025214 | A1 | | 2/2006 | Smith | |
| 2006/0215841 | A1 | | 9/2006 | Vielledent et al. | |
| 2007/0154035 | A1 | * | 7/2007 | Fukui | 381/116 |
| 2007/0211574 | A1 | | 9/2007 | Croft, III | |
| 2008/0261693 | A1 | | 10/2008 | Zalewski | |
| 2008/0279410 | A1 | | 11/2008 | Cheung et al. | |
| 2010/0016727 | A1 | | 1/2010 | Rosenberg | |
| 2010/0040249 | A1 | | 2/2010 | Lenhardt | |
| 2010/0041447 | A1 | | 2/2010 | Graylin | |
| 2010/0166222 | A1 | * | 7/2010 | Bongiovi | 381/103 |
| 2010/0302015 | A1 | | 12/2010 | Kipman et al. | |

(56) References Cited

U.S. PATENT DOCUMENTS

| | | | | |
|---|---|---|---|---|
| 2010/0303263 | A1 | 12/2010 | Hiensch | |
| 2011/0018710 | A1 | 1/2011 | Booij et al. | |
| 2011/0044467 | A1 | 2/2011 | Pompei | |
| 2011/0051977 | A1 | 3/2011 | Losko et al. | |
| 2011/0077080 | A1 | 3/2011 | Meer | |
| 2011/0103614 | A1 | 5/2011 | Cheung et al. | |
| 2011/0109248 | A1 | 5/2011 | Liu | |
| 2011/0212777 | A1 | 9/2011 | Chen | |
| 2011/0216928 | A1 | 9/2011 | Eisenberg et al. | |
| 2012/0029912 | A1 | 2/2012 | Almagro | |
| 2012/0051556 | A1 * | 3/2012 | Pompei | 381/77 |
| 2012/0057734 | A1 | 3/2012 | Schulein | |
| 2012/0148070 | A1 | 6/2012 | Norris | |
| 2012/0148082 | A1 | 6/2012 | Norris | |
| 2014/0104988 | A1 | 4/2014 | Norris | |
| 2014/0133668 | A1 | 5/2014 | Podoloff | |
| 2014/0161282 | A1 | 6/2014 | Norris | |
| 2014/0161291 | A1 | 6/2014 | Matsuzawa | |

FOREIGN PATENT DOCUMENTS

| | | |
|---|---|---|
| WO | WO01/08449 | 2/2001 |
| WO | WO01/15491 | 3/2001 |
| WO | WO01/52437 | 7/2001 |
| WO | WO 2008/046175 A1 | 4/2008 |
| WO | WO 2013/158298 | 10/2013 |

OTHER PUBLICATIONS

U.S. Appl. No. 13/160,065, filed Jun. 14, 2011; Elwood G. Norris.

PCT Application PCT/US2011/040388; filed Jun. 14, 2011; Elwood G. Norris; International Search Report mailed Dec. 26, 2011.

U.S. Appl. No. 13/160,065, filed Jun. 14, 2011; Elwood G. Norris; notice of allowance dated Dec. 17, 2012.

U.S. Appl. No. 13/837,237, filed Mar. 15, 2013; Elwood G. Norris.

PCT/US13/32214; filed Mar. 15, 2013; Elwood G. Norris.

Aoki et al; Parametric Loudspeaker—Characteristics of Acoustic Field and Suitable Modulation of Carrier Ultrasound, Electronics and Communications in Japan, Part 3, vol. 74, No. 9, 1991, pp. 76-82.

Berktay et al; Possible Exploitation of Non-Linear Acoustics in Underwater Transmitting Applications, J. Sound Vib., Apr. 13, 1965, vol. 2, No. 4, pp. 435-461.

Crandall et al; The Air-Damped Vibrating System: Theoretical Calibration of the Condenser Transmitter; American Physical Society; Dec. 28, 1917; pp. 449-460.

Makarov et al; Parametric Acoustic Nondirectional Radiator; Acustica; 1992; vol. 77, pp. 240-242.

PCT Application PCT/US2013/021064; Filed Jan. 10, 2013; Parametric Sound Corporation; International Search Report Mailed May 16, 2013.

U.S. Appl. No. 13/738,887, filed Jan. 10, 2013; Elwood G. Norris.

U.S. Appl. No. 13/863,971, filed Apr. 16, 2013; Elwood G. Norris.

U.S. Appl. No. 13/917,273, filed Jun. 13, 2013; Elwood G. Norris.

U.S. Appl. No. 13/917,315, filed Jun. 13, 2013; Elwood G. Norris.

U.S. Appl. No. 13/935,246, filed Jul. 3, 2013; Elwood G. Norris.

U.S. Appl. No. 13/160,051, filed Jun. 14, 2011; Elwood G. Norris; Office Action issued Jul. 19, 2013.

Wagner; Electrostatic Loudspeaker Design and Construction; Audio Amateur Press Publishers; 1993; Chapters 4-5; pp. 59-91.

Westervelt; Parametric Acoustic Array; The Journal of the Acoustical Society of America; Apr. 1963; vol. 35, No. 1, pp. 535-537.

Yoneyama et al.; The Audio Spotlight: An Application of Nonlinear Interaction of Sound Waves to a New Type of Loudspeaker Design; Acoustical Society of America; 1983; vol. 73, No. 5; pp. 1532-1536.

U.S. Appl. No. 13/160,051, filed Jun. 14, 2011; Elwood G. Norris; office action dated Oct. 31, 2013.

PCT Application PCT/US2014/018691; filing date Feb. 26, 2014; Parametric Sound Corporation; International Search Report mailed Jun. 6, 2014.

U.S. Appl. No. 13/761,484, filed Feb. 7, 2013; Elwood G. Norris.

EP Application EP11796319.9; filing date Jun. 14, 2011; Elwood G. Norris; European Search Report dated Jul. 29, 2014.

PCT Application PCT/US/2014/037786; filing date May 13, 2014; Parametric Sound Corporation; International Search Report mailed Sep. 11, 2014.

* cited by examiner

PARAMETRIC SIGNAL PROCESSING SYSTEMS AND METHODS

PRIORITY CLAIM

Priority is claimed of U.S. Provisional Patent Application Ser. No. 61/354,533, filed Jun. 14, 2010, and of U.S. Provisional Patent Application Ser. No. 61/445,195, filed Feb. 22, 2011, each of which is hereby incorporated herein by reference in its entirety.

RELATED CASES

This application is related to U.S. patent application Ser. No. 13/160,051, filed Jun. 14, 2011, titled Improved Parametric Transducers and Related methods, and is related to U.S. patent application Ser. No. 13/160,065, filed Jun. 14, 2011, titled Improved Parametric Transducer Systems and Related Methods.

BACKGROUND OF THE INVENTION

1. Field of the Invention

The present invention relates generally to the field of signal processing systems for use in audio reproduction.

2. Related Art

Non-linear transduction, such as a parametric array in air, results from the introduction of sufficiently intense, audio modulated ultrasonic signals into an air column. Self demodulation, or down-conversion, occurs along the air column resulting in the production of an audible acoustic signal. This process occurs because of the known physical principle that when two sound waves with different frequencies are radiated simultaneously in the same medium, a modulated waveform including the sum and difference of the two frequencies is produced by the non-linear (parametric) interaction of the two sound waves. When the two original sound waves are ultrasonic waves and the difference between them is selected to be an audio frequency, an audible sound can be generated by the parametric interaction.

While the theory of non-linear transduction has been addressed in numerous publications, commercial attempts to capitalize on this intriguing phenomenon have largely failed. Most of the basic concepts integral to such technology, while relatively easy to implement and demonstrate in laboratory conditions, do not lend themselves to applications where relatively high volume outputs are necessary. As the technologies characteristic of the prior art have been applied to commercial or industrial applications requiring high volume levels, distortion of the parametrically produced sound output has resulted in inadequate systems.

Whether the emitter is a piezoelectric emitter, or PVDF film or electrostatic emitter, in order to achieve volume levels of useful magnitude, conventional systems often required that the emitter be driven at intense levels. These intense levels have often been greater than the physical limitations of the emitter device, resulting in high levels of distortion or high rates of emitter failure, or both, without achieving the magnitude required for many commercial applications.

Efforts to address these problems include such techniques as square rooting the audio signal, utilization of Single Side Band ("SSB") amplitude modulation at low volume levels with a transition to Double Side Band ("DSB") amplitude modulation at higher volumes, recursive error correction techniques, etc. While each of these techniques has proven to have some merit, they have not separately, or in combination, allowed for the creation of a parametric emitter system with high quality, low distortion and high output volume. The present inventor has found, in fact, that under certain conditions some of the techniques described above actually cause more measured distortion than does a refined system of like components without the presence of these prior art techniques.

SUMMARY OF THE INVENTION

In accordance with one aspect of the invention, a signal processing system for generating an ultrasonic signal is provided, including an audio compressor, operable to compress a dynamic range of an audio input signal. An equalization network can be operable to equalize the audio signal. A low pass filter can be operable to remove high portions of the audio signal, and a high pass filter can be operable to remove low portions of the audio signal. An oscillator circuit can be operable to generate a carrier signal. A modulation circuit can be operable to combine the audio signal with the carrier signal to produce at least one modulated carrier signal.

In accordance with another aspect of the invention, the signal processing system for generating a parametric signal can consist of: an audio compressor, operable to compress a dynamic range of an audio input signal; an equalization network, operable to equalize the audio signal; a low pass filter, operable to remove high portions of the audio signal, and a high pass filter, operable to remove low portions of the audio signal; an oscillator circuit, operable to generate a carrier signal; and a modulation circuit, operable to combine the audio signal with the carrier signal to produce at least one modulated carrier signal.

In accordance with another aspect of the invention, the signal processing system for generating a parametric signal can consist essentially of: an audio compressor, operable to compress a dynamic range of an audio input signal; an equalization network, operable to equalize the audio signal; a low pass filter, operable to remove high portions of the audio signal, and a high pass filter, operable to remove low portions of the audio signal; an oscillator circuit, operable to generate a carrier signal; and a modulation circuit, operable to combine the audio signal with the carrier signal to produce at least one modulated carrier signal.

In accordance with another aspect of the invention, a method for generating a modulated carrier signal that can be emitted as a parametric wave is provided, comprising: compressing a dynamic range of an audio input signal to generate a compressed audio signal; equalizing the audio signal to generate an equalized audio signal; band pass filtering the audio signal to generate a filtered audio signal; and modulating a carrier signal with the compressed audio signal to generate a modulated carrier signal.

In accordance with another aspect of the invention, a method for generating parametric sound is provided, including: i) processing an audio input signal with a signal processing system consisting of: an audio compressor, operable to compress a dynamic range of an audio input signal; an equalization network; a low pass filter, operable to remove high portions of the audio signal; a high pass filter, operable to remove low portions of the audio signal; an oscillator circuit, operable to generate a carrier signal; and a modulation circuit, operable to combine the audio signal with the carrier signal to produce at least one modulated carrier signal; ii) providing the at least one modulated carrier signal to an emitter assembly; and iii) emitting the modulated carrier signal from the emitter assembly into a non-linear medium.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

The following drawings illustrate exemplary embodiments for carrying out the invention. Like reference numerals refer to like parts in different views or embodiments of the present invention in the drawings.

DETAILED DESCRIPTION

Figure 1:
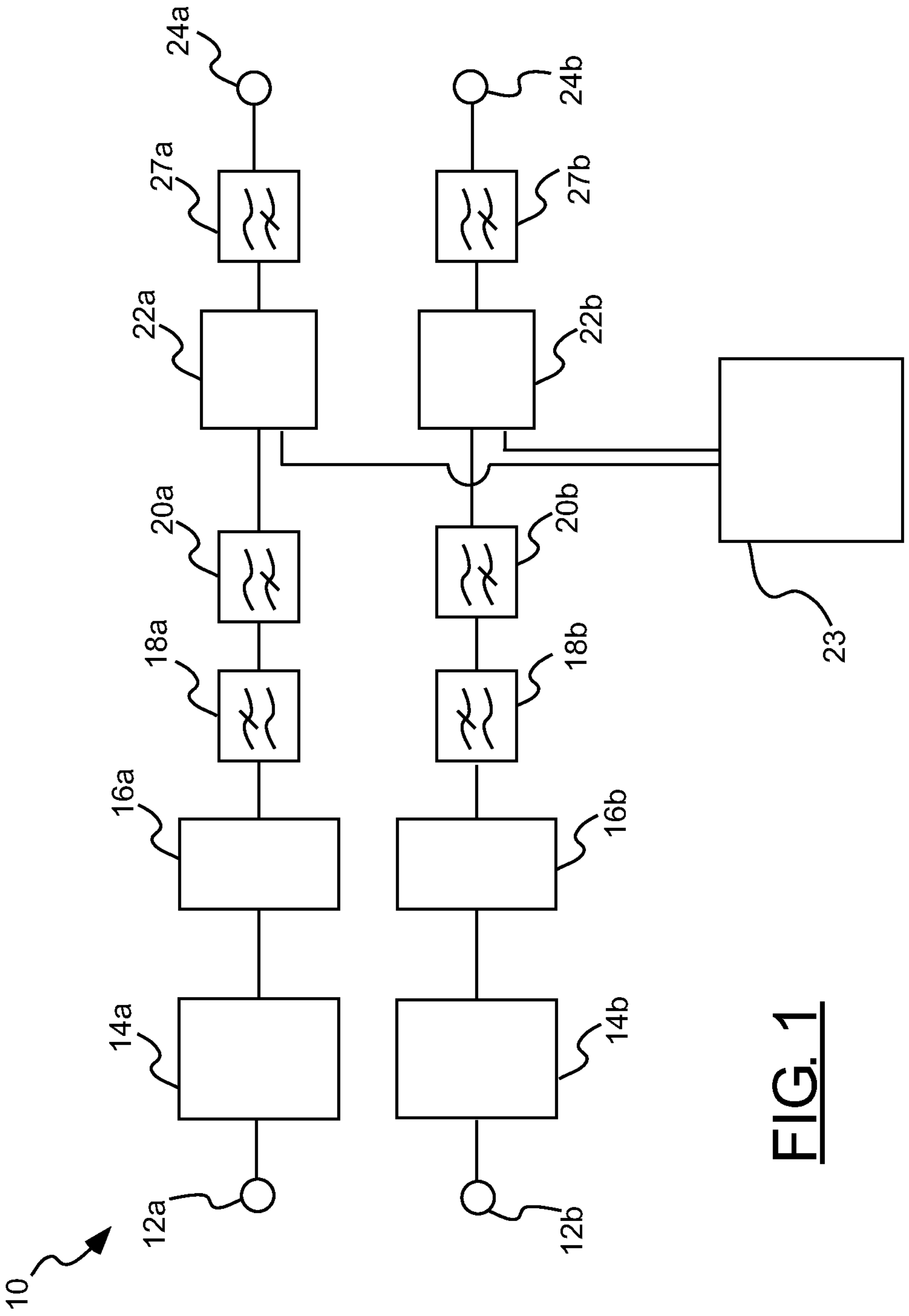
FIG. 1 is a block diagram of an exemplary signal processing system in accordance with one embodiment of the invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

DEFINITIONS

As used herein, the singular forms "a" and "the" can include plural referents unless the context clearly dictates otherwise. Thus, for example, reference to "an emitter" can include one or more of such emitters.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Invention

The present invention relates to improved signal processing systems for use in generating parametric audio signals. The systems described herein have proven to be much more efficient than the systems of the prior art (creating greater output with far lower power consumption), while also providing sound quality which could not be achieved using prior art parametric emitter systems.

One exemplary, non-limiting signal processing system 10 in accordance with the present invention is illustrated schematically in FIG. 1. In this embodiment, various processing circuits or components are illustrated in the step-wise order (relative to the processing path of the signal) in which they are arranged according to one implementation of the invention. While one or more embodiments of the invention are limited to the specific order discussed or shown herein, it is to be understood that the components of the processing circuit can vary, as can the order in which the input signal is processed by each circuit or component. Also, depending upon the embodiment, the processing system 10 can include more or fewer components or circuits than those shown.

Also, the example shown in FIG. 1 is optimized for use in processing multiple input and output channels (e.g., a "stereo" signal), with various components or circuits including substantially matching components for each channel of the signal. It is to be understood that the system can be equally effectively implemented on a single signal channel (e.g., a "mono" signal), in which case a single channel of components or circuits may be used in place of the multiple channels shown.

Referring now to the exemplary embodiment shown in FIG. 1, a multiple channel signal processing system 10 can include audio inputs that can correspond to left 12*a* and right 12*b* channels of an audio input signal. Compressor circuits 14*a*, 14*b* compress the dynamic range of the incoming signal, effectively raising the amplitude of certain portions of the incoming signals and lowering the amplitude of certain other portions of the incoming signals, resulting in a narrower range of audio amplitudes. In one aspect, the compressors lessen the peak-to-peak amplitude of the input signals by a ratio of not less than about 2:1. Adjusting the input signals to a narrower range of amplitude can advantageously eliminate overmodulation distortion which is characteristic of the limited dynamic range of this class of modulation systems.

After the audio signals are compressed, equalizing networks 16*a*, 16*b* provide equalization of the signal. The equalization networks advantageously boost lower frequencies to increase the benefit provided naturally by the emitter/inductor combination of the parametric emitter assembly (32*a*, 32*b* in FIG. 2).

Low pass filter circuits 18*a*, 18*b* can be utilized to provide a hard cutoff of high portions of the signal, with high pass filter circuits 20*a*, 20*b* providing a hard cutoff of low portions of the audio signals. In one exemplarily embodiment of the present invention, low pass filters 18*a*, 18*b* are used to cut signals higher than 15 kHz, and high pass filters 20*a*, 20*b* are used to cut signals lower than 200 Hz (these cutoff points are exemplary and based on a system utilizing an emitter having on the order of fifty square inches of emitter face).

Figure 3A:
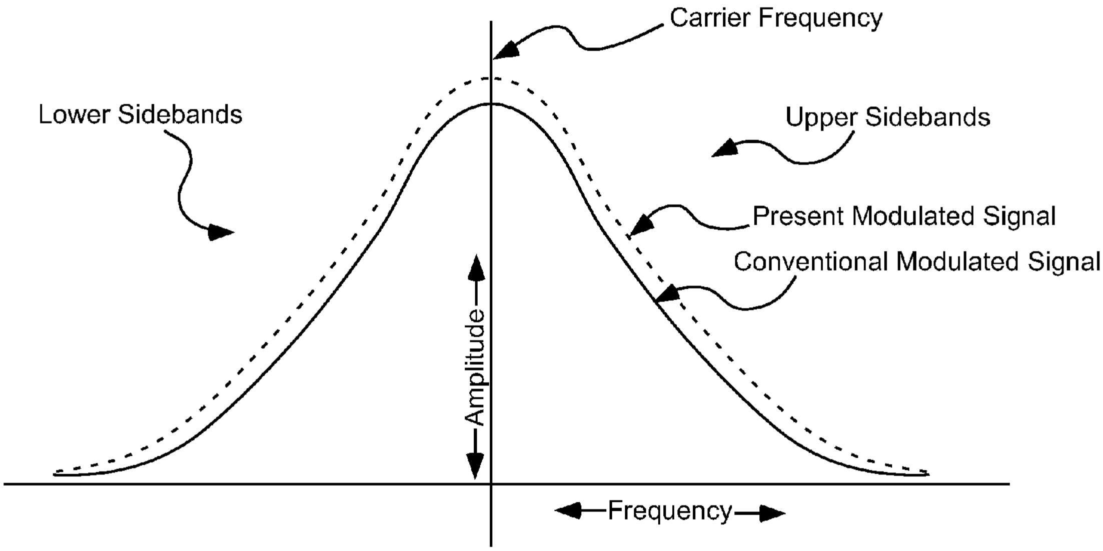
FIG. 3A is a frequency response curve of a typical double sideband modulated signal generated by a conventional signal processing system, shown with an improved frequency response curve (having increased amplitude) in accordance with the present invention overlaid thereon.
Figure 3B:
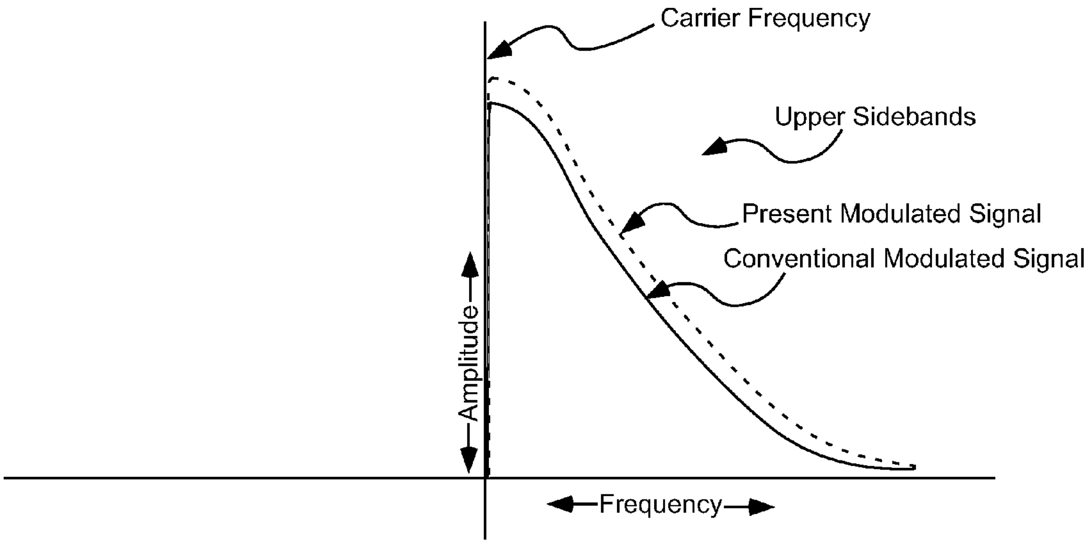
FIG. 3B is a frequency response curve of a typical single sideband modulated signal generated by a conventional signal processing system, shown with an improved frequency response curve (having increased amplitude) in accordance with the present invention overlaid thereon.

The high pass filters 20*a*, 20*b* can advantageously cut low frequencies that, after modulation, result in very little deviation of carrier frequency (e.g., those portions of the modulated signal of FIGS. 3A and 3B that are closest to the carrier frequency). These low frequencies are very difficult for the system to reproduce efficiently (e.g., much energy can be wasted trying to reproduce these frequencies), and attempting to reproduce them can greatly stress the emitter film (as they would otherwise generate the most intense movement of the emitter film).

The low pass filters 18*a*, a8*b* can advantageously cut higher frequencies that, after modulation, could result in the creation of an audible beat signal with the carrier. By way of example, if a low pass filter cuts frequencies above 15 kHz, with a carrier frequency of around 44 kHz, the difference signal will not be lower than around 29 kHz, which is still outside of the audible range for humans. However, if frequencies as high as 25 kHz were allowed to pass the filter circuit, the difference signal generated could be in the range of 19 kHz, which is well within the range of human hearing.

In the exemplary embodiment shown, after passing through the low pass and high pass filters, the audio signals are modulated by modulators 22*a* and 22*b*, where they are combined with a carrier signal generated by oscillator 23. While not so required, in one aspect of the invention, a single oscillator (which in one embodiment is driven at a selected frequency of between about 40 kHz to 50 kHz, which range corresponds to readily available crystals that can be used in the oscillator) is used to drive both modulators 22*a*, 22*b*. By utilizing a single oscillator for multiple modulators, an identical carrier frequency is provided to multiple channels being output at 24*a*, 24*b* from the modulators. This aspect of the invention can negate the generation of any audible beat frequencies that might otherwise appear between the channels while at the same time reducing overall component count.

While not so required, in one aspect of the invention, high-pass filters 27*a*, 27*b* can be included that serve to filter out signals below about 25 kHz. In this manner, the system can ensure that no audible frequencies enter the amplifier via outputs 24*a*, 24*b*. As such, only the modulated carrier wave is fed to the amplifier(s), with no accompanying audio artifacts.

Thus, the signal processing system 10 receives audio inputs at 12*a*, 12*b* and processes these signals prior to feeding them to modulators 22*a*, 22*b*. An oscillating signal is provided at 23, with the resultant outputs at 24*a*, 24*b* then including both a carrier wave (typically ultrasonic) and the audio signals that are being reproduced, typically modulated onto the carrier wave. The resulting output(s), once emitted in a non-linear medium such as air, produce highly directional parametric sound within the non-linear medium.

For more background on the basic technology behind the creation of an audible wave via the emission of two ultrasonic waves, the reader is directed to numerous patents previously issued to the present inventor, including U.S. Pat. Nos. 5,889,870 and 6,229,899, which are incorporated herein by reference to the extent that they are consistent with the teachings herein. Due to numerous subsequent developments made by the present inventor, these earlier works are to be construed as subordinate to the present disclosure in the case any discrepancies arise therebetween.

Figure 2:
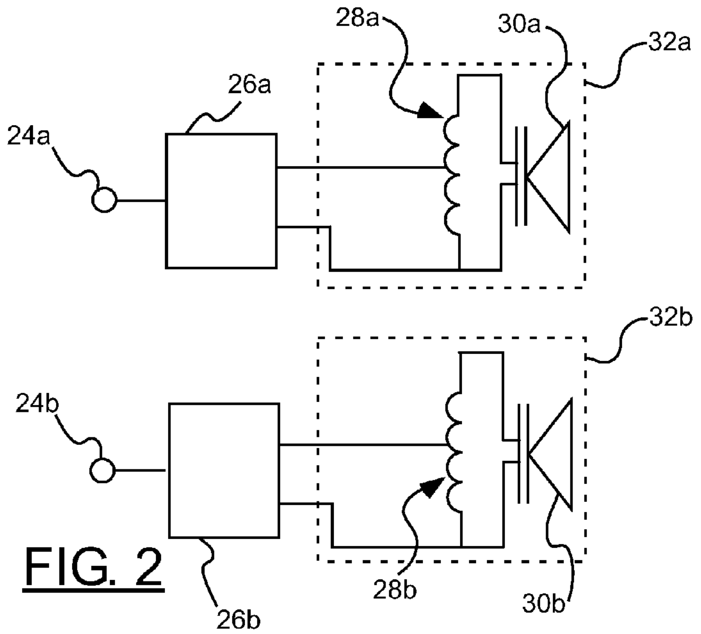
FIG. 2 is a block diagram of an exemplary amplifier and emitter arrangement in accordance with an embodiment of the invention.

Turning now to FIG. 2, the outputs 24*a*, 24*b* from the signal processing system 10 can be electronically coupled to amplifiers 26*a*, 26*b*. After amplification, the signal can be sent to emitter assemblies 30*a*, 30*b*, which can be any of a variety of known emitters capable of emitting ultrasonic signals. In one aspect of the invention, inductors 28*a*, 28*b* can be located "on-board" the emitters 30*a*, 30*b* (e.g., within the same casing, or attached to the casing, or located adjacent or near the same casing). By locating the inductors on-board the emitters, the signal can be carried from the processing system to the emitters (or from the amplifier to the emitters) across substantial distances using ordinary speaker wire without subjecting the lines that carry the signal to high voltages.

Conventional units in which a resonant matching inductor is placed on the amplifier board can generate very high voltages between the inductor in the lines or cables carrying the modulated signal to the emitter. These voltages can be sufficiently high so as to cause the signal lines to radiate through the air on the AM or FM radio frequency bands, thereby causing interference. This radiation can occur either from harmonics of the carrier or from the switching frequency used in a class D power amplifier, thus creating issues with obtaining necessary FCC and UL approvals.

By coupling the inductor or inductors of the present invention adjacent the emitter, and distal from the power amplifying and signal processing components, virtually any length of cabling can separate the signal processing system and the emitters. In this manner, the 8-10 times multiplication of the peak to peak ("p/p") amplifier output voltage generated by the resonant circuitry of the inductor (28*a*,28*b*) and emitter (30*a*, 30*b*) does not pass through the cabling (as would be seen in conventional units). This solution also avoids the requirement that the signal processing components, power amplifier and the emitter be packaged in the same unit, allowing greater flexibility in manufacture and cosmetic design. While the location of the inductor or inductors from the emitter can vary, in one aspect, the inductor or inductors are located within at least about three inches of the emitter. In one embodiment, the inductor or inductors are located at least about two feet from the power amplifying and signal processing components of the system.

A variety of suitable types of inductors 28*a*, 28*b* can be utilized. However, in one aspect of the invention, a fully shielded inductor, such as a pot core inductor, is utilized. This can minimize or eliminate hot spots being generated when the inductor is placed on or near the emitters. Because the pot core material itself is an effective magnetic shield, yet is not electrically conductive, such an inductor can be placed in close proximity to the emitter without fear of any kind of mutual coupling. The ability of locating the inductor close to the emitter contributes to providing emitters that are substantially thinner, lighter and more aesthetically pleasing.

As will be appreciated by one of ordinary skill in the art, the signal processing system 10 is comprised of relatively inexpensive components that operate with extremely low power consumption. Through the use of modern Integrated Circuits all functions can be accomplished in a single programmable chip (such as a device currently sold under the trade name Analog Devices' ADAU1701). The only significant power consumption of the present system is by amplifiers 26*a*, 26*b* (FIG. 2), which can be minimized with many modern, off-the-shelf class D amplifiers. The signal processing system also allows for the use of power amplifiers from existing systems, providing freedom to incorporate the processing system into a variety of existing technology. For example, even though the amplifiers 26*a*, 26*b* are readily available commercially (and relatively inexpensive), a user of the system may wish to use amplifiers from an existing machine (a vending machine, for example). In this case, the signal processing system from FIG. 1 can be easily incorporated into the existing machine to provide parametric audio capability to existing amplifiers of the machine.

The signal processing system 10 provides a number of advantages over prior art systems. For example, when used with a conventional electrically sensitive, mechanically responsive ("ESMR") film emitter, conventional systems often provide voltages to the emitter film that peak as high as 800 volts. Many such film emitters begin breaking down at 800 volts (p/p), or less. By combining audio amplitude compression and audio bandpass limiting, the current system has been found to peak at no more than about 300 volts p/p, much lower than the maximum operating voltages of most film emitters.

Additionally, signal take-off connections (not shown in the figures) can be readily incorporated into the present signal processing system (e.g., before audio compressors 14*a*,14*b*) to drive conventional low-frequency components such as subwoofer speakers. Typically, the need to provide directionality to such devices is not important, as the human ear cannot detect directionality of low frequency tones. Thus, the present system could satisfy a range of audio output frequencies with high quality, parametric performance. In addition, the present system can incorporate volume controls (not shown) that can adjust for different line inputs from different audio sources, such as iPods™, radios, CD players, microphones, etc.

When desired, the signal processing system 10 can include an automatic mute feature that reduces or eliminates power to the amplifiers in the event no audio signal is present. This feature can be incorporated into one or more of the components or circuits illustrated in FIGS. 1 and 2. By reducing or eliminating power provided to the amplifiers in the absence of an audio signal, unnecessary power usage and heat generation can be minimized.

The signal processing system can advantageously produce output that can be connected to and used by a variety of emitter types. In one example, an ESMR film emitter has been found to be particularly effective. Some exemplary, conventional ESMR film emitters are discussed in U.S. Patent Publication No. 20050100181, which is hereby incorporated herein by reference to the extent it is consistent with the teachings herein (however, the earlier work is to be construed as subordinate to the present disclosure in the case that any discrepancies exist therebetween).

FIG. 3A illustrates some of the advantages provided by the present invention, in which a double sideband amplitude modulation scheme is used. In FIG. 3A, the frequency characteristic of a conventional signal generator is shown, which can, for example, be 40 kHz resonant frequency. During operation, upper and lower sidebands are generated as a result of double sideband amplitude modulation of the carrier by an audio input signal. Shown overlaid thereon is the frequency characteristic of a signal generated by the present invention. As is shown, the present system generates a signal having an overall amplitude that is substantially increased relative to a conventional signal output, with no corresponding increase in the power input required.

FIG. 3B illustrates some of the advantages provided by the present invention, in which a single sideband amplitude modulation scheme is used. In FIG. 3B, the frequency characteristic of a conventional signal generator is shown, which can, for example, be 25 kHz resonant frequency. During operation, an upper sideband is generated as a result of single sideband amplitude modulation of the carrier by an audio input signal. Shown overlaid thereon is the frequency characteristic of a signal generated by the present invention. As is shown, the present system generates a signal having an overall amplitude that is substantially increased relative to a conventional signal output, with no corresponding increase in the power input required.

The system described above can provide numerous advantages over conventional systems. Due to the increase in sound output and quality, and the ability to precisely process stereo inputs, two emitters can be used together to produce true binaural sound quality without requiring the use of headphones (as all conventional binaural systems do).

The power requirements for the present system are drastically reduced from those of prior art systems. The present signal processing system can be driven by a simple power supply and consumes as little as 9 watts per channel at peak usage. Conventional systems often consume 130 watts at peak usage, and can range from 80-130 watts during continual use. Despite this reduced power requirement, the present system has been measured to output several times the volume of conventional systems.

The distortion levels produced by the present system are considerably lower than conventional systems. Some such systems have been measured to produce 50%-80% distortion. The present system measures less than 30% distortion (when used with single side band, or SSB, modulation, the distortion can be as low as 5-10%).

Despite all of the advantages provided by the system, it can be manufactured from relatively simple components at a fraction of the cost of conventional systems. For example, modern Integrated Circuits can be utilized such that all functions are accomplished in a single programmable chip. In one embodiment, an audio processor currently sold under the trade name Analog Devices ADAU1701 is utilized to implement the functionality illustrated in FIG. 1. Thus, a complete system can require only three or four readily available components: the audio processor described above; a machine-readable medium (such as an EPROM chip) to store programming and support the audio processor, and a small crystal to provide the modulation signal. In one embodiment, Class D amplifiers can be utilized to amplify the signal produced.

Some or all of the components can be digital components, which exhibit efficiencies on the order of 90% (as compared to 20-35% obtainable with analog components), and are much more reliable than many analog components. Digital components also reduce power supply needs and require much smaller heat sinks.

It will be appreciated by those of ordinary skill in the art that any configuration of the system may be used for various purposes according to the particular implementation. The control logic or software implementing the present invention can be stored on any machine-readable medium locally or remotely accessible by/to the audio processor. A machine-readable medium can include any mechanism for storing or transmitting information in a form readable by a machine. For example, a machine readable medium can include read-only memory (ROM), random access memory (RAM), magnetic disk storage media, optical storage media, flash memory devices, electrical, optical, acoustical or other forms of propagated signals (e.g. carrier waves, infrared signals, digital signals, etc.).

In one aspect of the invention, signal processing functions can be carried out primarily using digital signal processing ("DSP") techniques and components. In cases where the memory storage capacity of DSP components is insufficient, one or more audio codecs can be used for A/D conversion.

Figure 4:
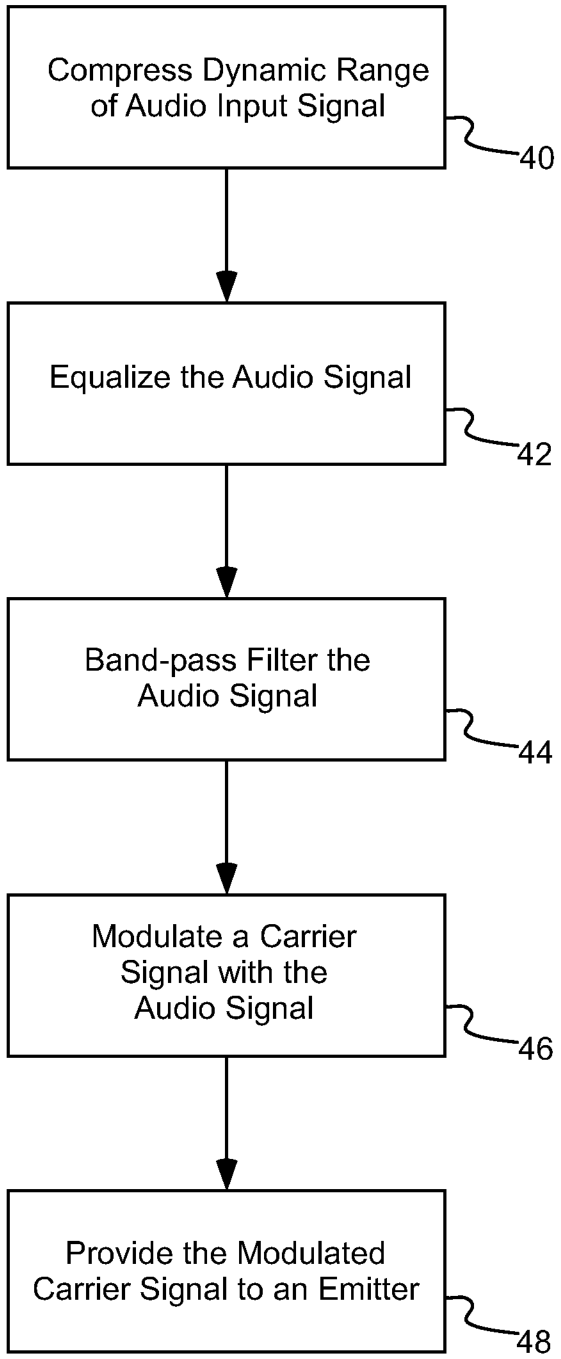
FIG. 4 is flow chart illustrating an exemplary method of processing an audio signal in accordance with one embodiment of the invention.

Turning now to FIG. 4, an exemplary method of processing an audio signal in accordance with the present invention is shown. In this example, the dynamic range of an input audio signal can be compressed at 40 (in some embodiments, compression is carried out prior to modulation of the audio signal). At 42, the audio signal can be equalized. At 44, a band-pass module can filter the audio signal. At 46, a carrier wave can be modulated with the audio signal. At 48, the modulated carrier wave can be provided to a suitable emitter.

While the present invention has been described having varying components described in varying positions relative to the order in which an audio signal can be processed, in some embodiments of the invention, the order in which the audio signal is processed can significantly affect the performance of the systems. Thus, some (but not all), claimed embodiments are limited to the precise components recited, and can be limited to processing an audio signal in the precise step-wise order in which the components are claimed or shown. Similarly some (but not all) of the methods claimed or described herein are limited to the precise step-wise order in which the process steps are recited.

It is to be understood that the above-referenced arrangements are illustrative of the application for the principles of the present invention. Numerous modifications and alternative arrangements can be devised without departing from the spirit and scope of the present invention while the present invention has been shown in the drawings and described above in connection with the exemplary embodiments(s) of the invention. It will be apparent to those of ordinary skill in the art that numerous modifications can be made without departing from the principles and concepts of the invention as set forth in the examples.

I claim:

1. A method for generating a modulated carrier signal that can be emitted as a parametric wave, comprising:

compressing a dynamic range of an audio signal to generate a compressed audio signal; equalizing the audio signal to generate an equalized audio signal; band pass filtering the audio signal to generate a filtered audio signal; and modulating a carrier signal with the compressed audio signal to generate a single sideband ("SSB") modulated carrier signal; the single sideband ("SSB") modulated carrier signal being of sufficient intensity so as to demodulate when emitted into a non-linear medium; wherein modulating the carrier signal includes utilizing a single oscillator circuit to drive at least a pair of modulators, each of which modulates a carrier signal with a filtered audio signal.

2. The method of claim 1, further comprising filtering the modulated carrier signal to remove any audio artifacts prior to delivering the modulated carrier signal to an amplifier.

3. The method of claim 1, wherein compressing the dynamic range of the audio input signal is performed prior to modulation of the carrier signal by a modulation circuit.

4. The method of claim 1, further comprising providing the modulated carrier signal to an emitter, the emitter being operable to emit the modulated carrier signal into a non-linear medium.

5. The method of claim 4, further comprising an inductor, associated with the emitter, the inductor being coupled adjacent the emitter.

6. The method of claim 5, wherein the inductor comprises a fully shielded pot core inductor.

7. A method for generating a parametric sound, comprising:

i) processing at least two audio input signals with at least two signal processing systems, each processing system comprising an audio processor, operable to compress a dynamic range of an audio input signal; an equalization network; a low pass filter, operable to remove high portions of the audio signal; a high pass filter, operable to remove low portions of the audio signal; an oscillator circuit, operable to generate a carrier signal; and a modulation circuit, operable to combine the audio signal with the carrier signal to produce at least one single sideband ("SSB") modulated carrier signal;

ii) providing the at least one single sideband ("SSB") modulated carrier signal to an emitter assembly; and iii) emitting the modulated carrier signal from the emitter assembly into a non-linear medium, the modulated carrier signal being of sufficient intensity to demodulate in the non-linear medium; wherein modulating each audio signal includes utilizing a single oscillator circuit to drive at least a pair of modulators each of which modulates a carrier signal with a filtered audio signal.

8. The method of claim 7, further comprising an inductor, associated with the emitter, the inductor being coupled adjacent the emitter.

9. The method of claim 8, wherein the inductor comprises a pot core inductor.

10. The method of claim 7, wherein the dynamic range of the audio signal is compressed prior to combining the audio signal with the carrier signal.

11. The method of claim 7, further comprising filtering the modulated carrier signal to remove any audio artifacts prior to delivering the modulated carrier signal to an amplifier.

* * * * *